United States Patent
Rhee et al.

Patent Number: 6,017,658
Date of Patent: *Jan. 25, 2000

[54] LITHOGRAPHIC MASK AND METHOD FOR FABRICATION THEREOF

[75] Inventors: Kee W. Rhee; Martin C. Peckerar, both of Silver Spring; Christie R. K. Marrian, Marbury; Elizabeth A. Dobisz, Owings, all of Md.

[73] Assignee: The United States of America as represented by the Secretary of the Navy, Washington, D.C.

[*] Notice: This patent is subject to a terminal disclaimer.

[21] Appl. No.: 07/882,226

[22] Filed: May 13, 1992

[51] Int. Cl.[7] .......................................... G03F 9/00
[52] U.S. Cl. ............................... 430/5; 250/492.2
[58] Field of Search ................. 430/5; 250/492.2

[56] References Cited

U.S. PATENT DOCUMENTS 4,463,265  7/1984  Owen et al. ..................... 250/492.2
4,764,441  8/1988  Ohta et al. ............................ 430/5

Primary Examiner—Mark Chapman
Attorney, Agent, or Firm—Thomas E. McDonnell; George Kap

[57] ABSTRACT

Improvement in resolution in terms of minimum feature sizes and proximity effects in an electronic mask is attained by making the mask using a high voltage electron beam which deflects or blocks backscattered electrons. The novel mask structure comprises a transparent support, an absorber layer disposed on said support, a dielectric layer disposed on said absorber layer, and a resist layer disposed on said dielectric layer. It is the dielectric layer which is credited for improving resolution in said mask which can be used a multiple number of times in printing a pattern for various applications, including electronic devices and integrated circuits.

8 Claims, 6 Drawing Sheets

LITHOGRAPHIC MASK AND METHOD FOR FABRICATION THEREOF

FIELD INVENTION

This invention pertains to improving resolution in making electronic masks. More specifically, this invention pertains to reduction of minimum feature sizes and proximity effects by reducing backscattering of electrons in high voltage electron beam lithography used in making electronic masks.

DESCRIPTION OF PRIOR ART

Recently, there has been an interest in the development of x-ray technology as an exposure source in the production of electronic devices, such as integrated circuits. Presently, x-ray lithography is believed to be the most promising path on the horizon for manufacturing integrated circuits of 0.25 um and less. There are still many elements of the lithographic process to be developed in order to meet the goal of manufacturing ultra large scale integrated circuits with feature sizes in the range of 0.10 um.

One of the most critical components in the field is the ability to fabricate x-ray masks or optical masks with high contrast and increasingly smaller feature sizes. The x-ray masks are usually made of a thin membrane carrying an absorber material. The material used as the x-ray mask absorber, which is normally of high atomic number or high Z, depends on whether the fabrication process is additive or substractive. Gold electroplating and RF-sputtering of tungsten, both examples of these methods, have been developed as x-ray absorbers and as absorbers for electronic masks. At least some of the absorbers can cause backscattering effects that degrade resolution and thus increase proximity effects.

X-ray mask implies that the incident exposure beam on a resist in the manufacture of an electronic device are x-rays. It should be understood that this invention pertains to x-ray masks and other masks regardless of what is the incident exposure beam. The exposure beam can be other than x-rays and generally is selected from electrons, photons, and ions.

In electron beam lithography for making masks, an absorber which is to be patterned, is covered by a thin layer of a resist which is sensitive to bombardment of electrons supplied in an electron beam incident on the resist. These electrons decelerate as they pass through the resist thereby depositing energy in the resist along the trajectories of each of these electrons. The deposited energy has a bell-shaped distribution which is a function of the lateral displacement from the center of the beam.

Electrons in an electron beam should pass entirely through the resist layer and into the absorber so that the entire thickness of the resist layer can be exposed by the electrons. If the initial energy of the incident electrons is such that the electrons come to rest in the resist, the charge builds up in those localized regions where the electrons come to rest in the resist. Because localized regions of charge in the resist deflect the electron beam, portions of the circuit patterns which have already been drawn affect portions of the circuit pattern which are subsequently drawn. Such deflection results in errors in the pattern which is transmitted by the mask to the electronic devices. Therefore, energy of the incident electrons should be chosen to be sufficient to insure that the electrons pass through the resist layer and into the absorber.

Generally, energy on the order of 10 keV is sufficient to insure that the electrons pass through the resist and the absorber. Unfortunately, a significant fraction of incident electrons are scattered back into the resist film and produce an undesirable exposure of the resist layer. This effect has been reported in connection with 10 keV electron beam incident on a 0.4 micron thick resist layer of poly (methylmethacrylate) on top of a silicon support. The energy deposited in the resist by the backscattered electrons has a bell distribution which is a function of lateral displacement from the center of the electron beam. The extra exposure of the resist by these backscattered electrons causes proximity effects which affect resolution of lithographic features on the order of up to 1 micron or less.

The substrate in electronic masks is composed of an absorber and a transparent support. The resolution in electron beam lithography is degraded by forward scattering of the primary electron beam in the resist and backscattering of the electron beam from the absorber. The forward and backscattered electrons generate secondary and fast secondary electrons which also cause proximity effects, expose the resist, and degrade the resolution. The forward scattering is minimized by the use of a thin resist and high energy electron probes. The most widely employed strategy to reduce backscattered electron effects is to employ a high energy electron beam which penetrates deep into the substrate. However, this does not solve the problem. The backscattered electrons are widely dispersed over an area much larger than the incident probe diameter and the resulting backscattered electron dose is a uniform "fog" one or more orders of magnitude lower than the dose from the primary electron beam.

U.S. Pat. No. 4,463,265 to Owen et al describes correction for the undesirable exposure due to backscattered electrons by reversed field pattern exposure. In lines 16–20, col 3, and claim 4 of this patent, reference is made to an electron absorbing layer between the resist layer and the substrate to reduce amount of backscattered energy.

SUMMARY OF INVENTION

It is an object of this invention to correct undesirable exposure by an electron beam of a resist in mask manufacture resulting from backscattered electrons from absorber and the underlying structure of the mask.

It is another object of this invention to reduce or eliminate effect of backscattered electrons on a resist disposed on an absorber in high voltage or high energy electron beam lithography.

It is another object of this invention to reduce or eliminate the detrimental effect of backscattered electrons in a direct write and projection electron beam lithography used in the manufacture of electronic masks;

It is another object of this invention to reduce proximity effects in electronic circuits disposed on a mask manufactured by the use of high voltage electron beam lithography.

These and other objects of this invention are accomplished by the mask which is made using high voltage electron beam, which mask comprises a transparent support, an absorber disposed on the support, a dielectric layer disposed on the absorber, and a resist layer disposed on the dielectric layer. The dielectric layer appears to block or absorb at least some of the electrons emanating from the absorber and the underlying structure so that the backscattered electrons are prevented from entering the resist layer and undesirably exposing same. Manufacture of the mask generally involves writing a pattern of an electronic circuit on the resist with a high voltage electron beam thus exposing the resist, developing the resist with a suitable developer, and etching the resist pattern into the dielectric layer and the absorber.

DETAILED DESCRIPTION OF INVENTION

This invention generally relates to improving resolution in electronic masks made by high voltage electron beam lithography by reducing proximity effects. More specifically, this invention relates to interposition of a dielectric layer between a resist and an absorber disposed on a transparent support.

Figure 1:
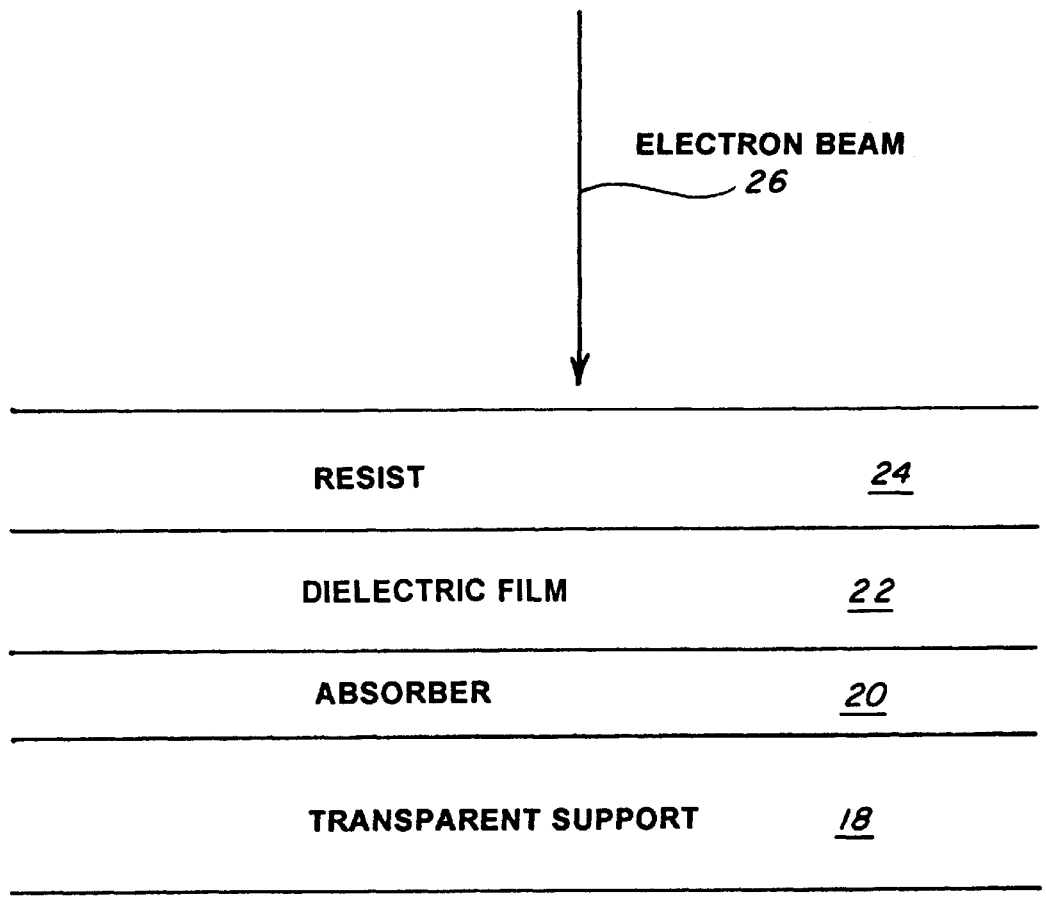
FIG. 1 is schematic diagram of an electronic masks of this invention made by high voltage electron beam, which comprises a support, an absorber disposed on the support, a dielectric layer disposed on the absorber, and a resist disposed on the dielectric layer.

FIG. 1 more specifically illustrates the invention herein which comprises transparent support 18 having disposed directly thereover and being in contact with absorber 20, dielectric layer or film 22 disposed over and being in contact with absorber 20, and a suitable resist layer 24 disposed directly over and being in contact with dielectric layer 22. High voltage or high energy beam 26 is directed at the resist layer 24 from above.

The purpose of the dielectric layer is to improve resolution of electronic circuits which are made using the masks. In high voltage electron beam direct write lithography, the electrons which are backscattered from the absorber create fast secondary and secondary electrons which together with the backscattered electrons are deflected or shielded by the dielectric layer and thus are prevented from entering the resist layer. If the backscattered electrons were allowed to enter the resist layer, the electrons, depending on their energy, would expose a portion of the resist and thus would impair the structural integrity of the lines written on the resist by an electron beam. As used herein, the term "backscattered electrons" includes all electrons entering the resist from below the resist and includes fast secondary and secondary electrons. Structural integrity manifests itself in the desire to have sharp edges with no exposure between the areas where resist is to be exposed.

The dielectric layer is composed of dielectric material which is a nonconductor to electricity. It also must be able to be deposited in a facile manner on a support in a relatively thin layer or film and be generally compatible with existing batch processing in the manufacture of integrated circuits. The dielectric layer serves as a barrier layer to backscattered electrons. It is transparent to incident electron beam electrons. Thickness of the dielectric layer can vary from about 1 to about 1000 nanometers (nm), preferably 10 to 400 nm. Although any dielectric material can be used as the dielectric layer, the presently preferred dielectric materials are silicon nitride ($Si_3N_4$) and silica ($SiO_2$), which can be applied onto the absorber by spinning, spraying, dip-coating but are preferably applied by chemical vapor deposition due to their physical state. Other nonstoichiometric silicon nitrides ($SiN_x$) and silicon oxides ($SiO_x$) are also preferred.

Chemical vapor deposition processes can create a thin film of a dielectric on the surface of a workpiece, or absorber in this instance, through the pyrolytic decomposition and subsequent surface reaction of molecules introduced as a gas. Control of gas flows, temperature, and base pressure are emphasized to get uniformity of film thickness and properties. It is desirable to use lamp energy in chemical vapor deposition since such energy is deposited only on the surface of an absorber and the absorber is not heated through its depth. This can reduce warpage. Both crystalline and non-crystalline materials can be deposited in this manner. Systems used for growth of crystalline materials are generally operated at about 1100° C. whereas for polycrystalline or amorphous materials, lower operating temperature is used.

Some variants on chemical vapor deposition involve the use of lasers. Such variants use intense, focused laser beam to initiate chemical vapor deposition surface reaction which can be initiated through local heating effects or the surface bonding configuration can be changed and made more reactive by light-matter interaction. A deposition of a number of materials is possible using this technique.

Dielectric layers deposited by high and low temperature processes have been found to work pursuant to the invention disclosed herein.

Suitable resists generally fall into two broad classes of positive and negative resists. These resists are radiation-sensitive thin films. Positive-acting resists become more soluble in the developing solvent after exposure, which is caused by a crosslinking reaction resulting from photon or electron interation. If a small region of a negative resist is exposed, only the exposed region will be covered by the resist after development. The positive resist works in the directly opposite way from the negative resist i.e., if a small region of a positive resist is exposed, only the exposed region will be removed or washed-out after development.

Any positive or negative resist material suitable for electron lithography can be used as the resist layer in the invention disclosed herein. Resists that exhibit tens-of-nanometer resolution, good adhesion to the underlying dielectric layer, good degree of process resistance, and thickness variations of less than 10 nm are available. The resist thickness contemplated for the electronic masks is about 1 to about 2000 nm, preferably from 10 to 1000 nm.

The highest resolution commercially available positive resist is poly(methylmethacrylate), however, it has a very limited etch resistance which makes it incompatible with many pattern transfer techniques. The reason poly(methylmethacrylate) is a positive resist is because it will engage in bond scission when exposed to electron beams, x-rays, or deep ultraviolet radiation. Negative resists are attractive for reverse tone patterning and are very robust to subsequent etching. However, the highest resolution negative resists do not exhibit resolution as high as that of poly (methylmethacrylate) positive resist. The poorer resolution of negative resists is believed to be due to lower sensitivity, lower contrast and post exposure processing required of negative resists. Since an x-ray resist is exposed by photoelectrons generated by a photoelectric x-ray source, the same resist used in electron beam lithography can be used in x-ray lithography.

Examples of suitable positive resists for the masks described herein include poly(methylmethacrylate) or PMMA, PBS and poly (butene-1sulfone). Examples of suitable negative resists for the masks described herein include chemically amplified novolacs, epoxidized poly (butadiene), poly(butadiene), poly(diallyl orthophthalate), and poly (glycidyl methacrylate-co-ethylacrylate). Increase in resist sensitivity can be achieved by doping the resist with suitable highly absorbing impurities. The high resolution negative resist used herein were MICROPOSIT XP-901104A (SAL-603) and SAL-601-ER7, from Shipley Company, which are nonolac-based resists with chemically amplified crosslinking systems.

The resist can be applied onto a workpiece or the dielectric layer in any suitable manner including spinning, spraying or dip-coating.

In the spinning method, the coated support is placed in a vacuum chuck capable of holding it securely while it is spun at a high speed of about 1–10 kilo RPM. The resist material is applied to the surface of the coated support prior to spinning. During spinning, excess resist material is flung off the support surface and surface tension pulls the remaining film flat. Resist layer can also be sprayed on the support surface or the workpiece can be dip-coated if physical state of the resist layer permits it. Prior to any application of the resist layer, the support resist receives a dehydration bake at about 200° C. to remove water vapor. The final thickness of the resist layer is determined by the spin speed as well as by resist layer composition, mean molecular weight, and viscosity.

The spinning technique provides films of exceptional uniformity. Better than 10 nm thickness control can be obtained and this can be verified by ellipsometry on a flat substrate.

The support medium can be thick or thin. Thick support media, such as glasses or quartz, have thickness of about 1 to about 1500 um, preferably 100 to 800 um, whereas thin support media, such as silicon carbride, silicon nitride, boron nitride, diamond, silicon, or carbon, have thickness of about 0.01 to about 10 um, preferably 0.1 to 5 um. Generally, thick support media is used in ultraviolet lithography and thin support media is used in x-ray lithography and other lithographies. Examples of available thin support media include silicon (Si) of 2 to 4 um thickness, berillium (Be) of 12 um thickness, silicon nitride ($Si_3N_4$) of 0.2 to 0.5 um thickness, alumina ($Al_2O_3$) of 0.2 um thickness, polymer of 25 um thickness, Mylar Or of 3 to 6 um thickness, and Polyimide of 0.5 um thickness.

The support medium is transparent to the exposing radiation, whether it be photons, electrons or ions. Although the masks herein described are made by the use of high voltage direct write electron beam lithography, it should be understood that the exposing medium in the manufacture of electronic devices can be an electron beam or another exposing medium.

Since the support medium is usually an insulator, the absorber should also be capable of dissipating electronic charge at a rate sufficient to avoid charging problems during electron beam exposure. Examples of suitable absorber materials include chromium, chromium with an antireflection layer, iron oxide deposited by sputtering or chemical vapor deposition, gold and tungsten. Preferably, chromium or ferric oxide are used when the mask is used in uv lithography whereas tungsten or gold is used when the mask is used in x-ray lithography for making electronic devices. Thickness of an absorber is up to about 1500 nm, preferably 30 to 1000 nm.

The material used as the electronic mask absorber, normally of high atomic number or high Z, depends on whether the fabrication process is additive or substractive. Gold electroplating and RF-sputtering of tungsten, both examples of these methods, have been developed for x-ray mask absorbers. Tungsten provides a closer match to the thermal expansion of silicon and seems preferable. Tungsten is, however, a heavy metal with Z of 74 and can cause substantial backscattering effects that degrade resolution.

Lithographic resolution in preparing a mask for fabrication of circuits is believed to be limited by effects of backscattered, fast secondary and secondary electrons, diffusion of acid catalyst, and inherent resolution of resist materials. In the situation described herein, i.e., high voltage electron beam lithography, it is the backscattered electrons which are believed to negatively or undesirably affect resolution. Therefore, this invention relates to reducing or eliminating the undesirable effects of backscattered, fast secondary and secondary electrons. The effect of backscattered electrons refers to that produced by electrons entering the resist layer from regions below the resist layer. These electrons include those elastically scattered from the substrate into the resist and the effects of fast secondary and secondary electrons, which are produced by inelastic collisions experienced by primary or elastically backscattered electrons. The secondary electrons result from many electronic processes and have energy of less than 50 eV. The secondary electrons do not travel more than about 5 nm and do not critically limit the resolution. The fast secondaries result from electronic core processes in the substrate material and are on the order of 100–3000 eV. The fast secondaries can travel distances of up to 500 nm and are detrimental to the resolution. The dielectric layer is believed to deflect fast secondaries, which cause undesirable exposure in the resist.

An alternative method of improving lithographic resolution is to use a low energy primary electron beam. Incident electrons of 15 to 50 eV do not scatter over large distances and degrade the resolution. With a low voltage electron beam, generated by a scanning tunneling microscope, the high resolution of SAL-601 resist has been demonstrated with 22 nm linewidths on Si substrates and 35 nm linewidths on GaAs substrates. At high voltage, lines of 80 nm linewidths have been written on Si and GaAs substrates. A strong substrate dependance, at high voltages of linewidth on dose is further evidence that the resolution is determined by electron scattering rather than by post exposure processing of the resist. However, due to technological challenges, low voltage probes have not been demonstrated in mask manufacture or electronic circuit fabrication. For purposes herein, high voltage or high voltage electron beam lithography operates at a voltage of about 1 to 500 keV, preferably 10 to 100 keV. Present commercial electron beam lithography systems generate electron beams at a voltage of about 20 to 50 keV. For purposes herein, high voltage or high voltage electron beam lithography is defined as 1 to 500 keV, preferably 10 to 100 keV. Present commercial high voltage electron beam lithography systems emit electron beams at a voltage of about 10 to 100 keV.

In the work described herein, electron beam irradiation was carried out on a high resolution vector scanner, JEOL JBX5D II. Because of the high resist sensitivity, the fourth lens and the second deflector where used, permitting a minimum address structure of 25 nanometers (nm). The beam current was 100 picoamps (pA) and voltage was 50 kiloelectron volts (keV), yielding a Gaussian beam diameter of about 50 nm.

In carrying the work described herein, three types of samples were used: silicon 300–400 microns thick, silicon 300–400 microns thick with a 220 nm thick layer of silicon dioxide, and silicon 300–400 microns thick with a 400 nm thick layer of RF-sputtered tungsten. All samples received identical processing, i.e. cleaning, dehydration-bake at 200° C., vapor priming with hexamethyldisilazane, spin-coated with a 400 nm-thick negative resist XP-90104A from Shipley Company, and soft-baking at 90° C. for 30 minutes. Following electron beam exposure, the samples were post-baked at 110° C. for 5 minutes. The latent resist images were developed by immersion using gentle or no agitation in MF-312 developer from Shipley Company for 40 seconds followed by a rinse in deionized water.

Figure 2:
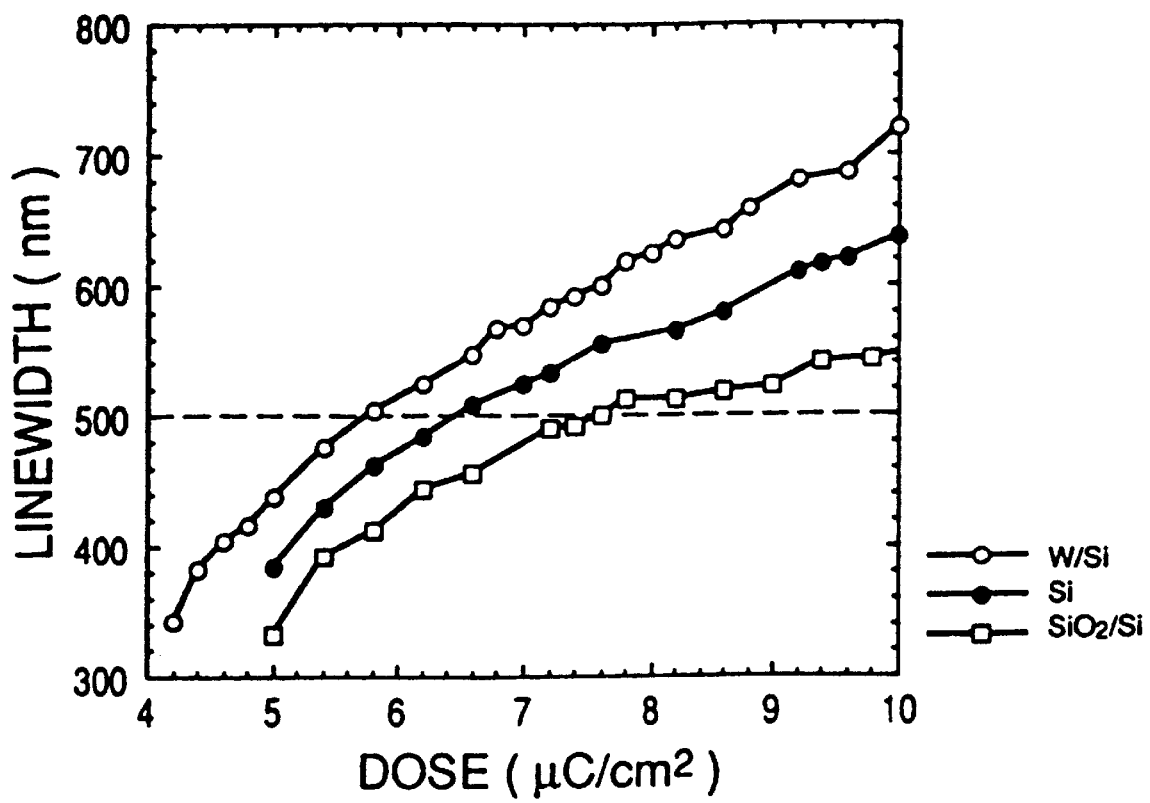
FIG. 2 is a comparison of patterned linewidths as a function of electron beam dose for three substrates: bare silicon, silicon with 0.22 um thick silicon dioxide, and silicon with 0.4 um thick tungsten with the represented coded feature size of 0.5 um equal lines and spaces.

FIG. 2 shows the dependence of proximity effects on the substrate material. The linewidths of the center lines of the gratings were plotted as a function of exposure dose for the three samples examined. This example is for 0.5 um line by 0.5 um spacing data. As anticipated, the proximity effect was more severe for the patterns written on the tungsten on silicon sample than on the silicon sample. Furthermore, the silicon dioxide layered onto silicon seems to filter the backscattered electrons, giving better linewidth resolution than the uncoated silicon sample. FIG. 2 indicates that for a given dose, the linewidth on the tungsten silicon sample is as much as 20% wider than on the silicon dioxide/silicon sample. The dose required to achieve a particular linewidth on a sample also increases in the same order, i.e., the tungsten/silicon sample requires the least and the silicon dioxide/silicon sample requires the greatest exposure.

Figure 3A:
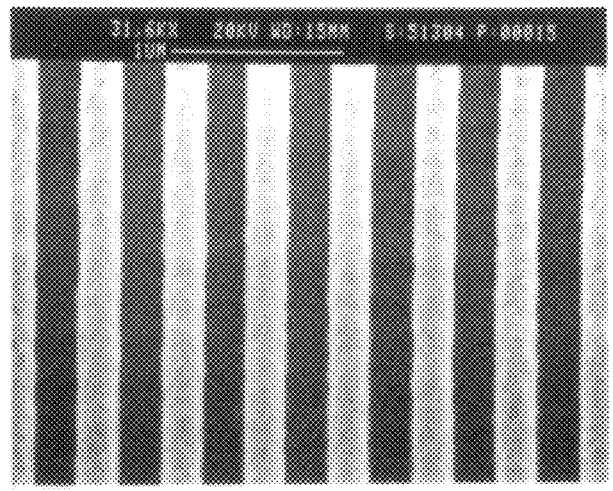
FIG. 3 represents scanning electron micrographs of line gratings patterned in 0.4 um thick negative resist on three substrates (a) bare silicon, (b) silicon with 0.22 um thick silicon dioxide, and (c) silicon with 0.4 um thick tungsten wherein the patterns consisted of 0.5 um period ten single path lines with electron beam exposure line dose at 0.2 nC/cm and the electron beam energy at 50 keV.
Figure 3B:
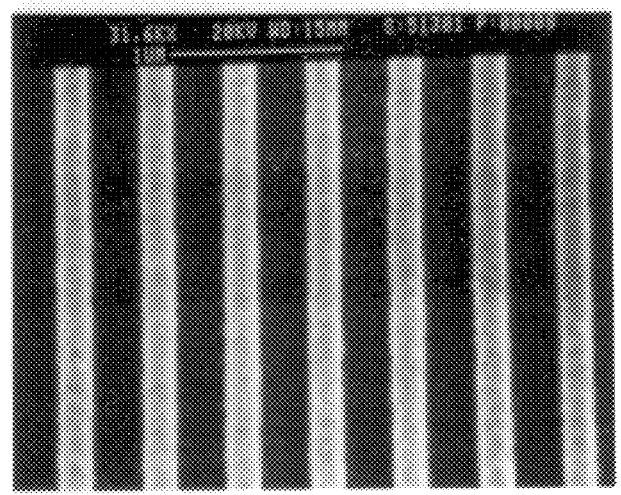
Figure 3C:
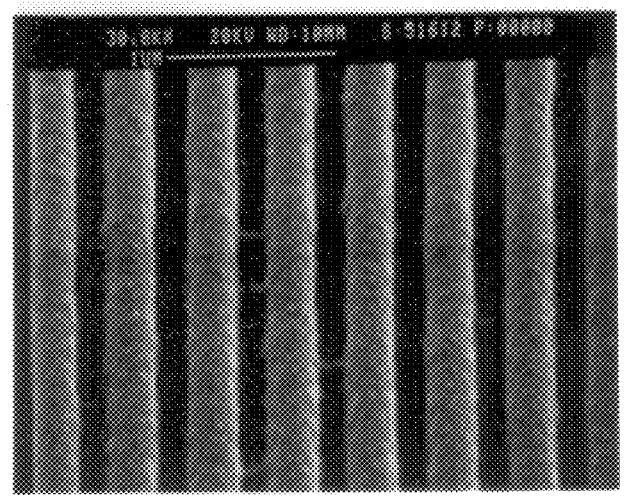

FIG. 3 shows scanning electron microscope (SEM) micrographs comparing line gratings patterned on 0.4 um-thick resist on the three samples. The patterns consisted of single-path lines with a 0.5 um pitch. The e-beam exposure line dose was 0.2 nC/cm. The resulting linewidths were 0.2 um, 0.25 um and 0.29 um on $SiO_2$/Si, Si and W/Si, respectively.

Figure 4A:
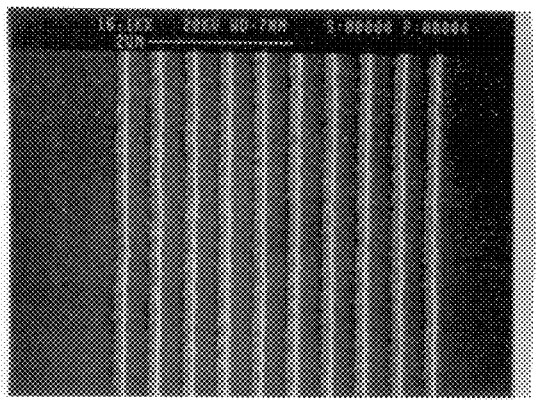
FIG. 4 represents scanning electron micrographs of grating with 0.25 um lines and spaces written in 0.4 um thick negative resist using a 50 keV electron beam on (a) silicon dioxide on silicon and (b) tungsten on silicon.
Figure 4B:
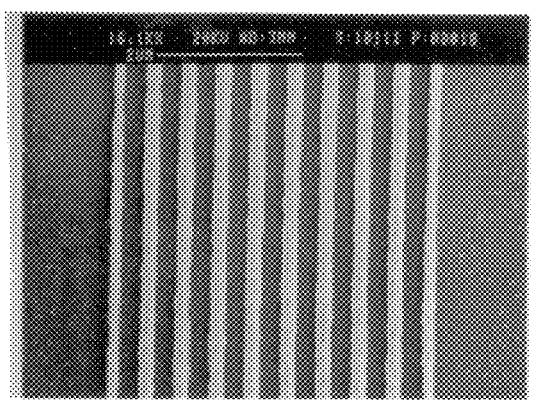

FIG. 4 depicts SEM micrographs of gratings patterned at the same dose on tungsten/silicon and silicon dioxide/silicon samples, the gratings were 0.25 $\mu$m×0.25 $\mu$m. The tungsten/silicon sample exhibits a classic example of proximity effect within the gratings. There is a 25% increase in linewidth of the central line relative to the outermost line in the tungsten/silicon sample. In contrast, the proximity effect is substantially smaller for patterns formed on the silicon dioxide/silicon sample. It is believed that thin films of silicon dioxide act as efficient filters for backscattered electrons, i.e., the already weakened backscattered electrons appear to be unable to pass through the silicon dioxide.

In another experiment, silicon (100) wafer or supports were first coated with 0.4 $\mu$m thick RF sputtered tungsten film and then with atmospheric pressure chemically deposited silicon dioxide or silica ($SiO_2$) in thickness of 100 nm, 200 nm and 400 nm. Deposition temperature was 400° C. A negative-tone chemically amplified novolac resist, SAL-601 from Shipley Company, was spin-coated to a single-layer or monolevel structure of 550 nm thickness, soft baked at 90° C. for 30 minutes, exposed with an electron beam, post-baked at 105° C. for 5 minutes, and developed in 10 minutes with MF-622 developer, also from Shipley Company. The samples were de-scummed in an oxygen plasma and struck in a barrel etcher at 50 watts. The electron beam lithography was performed at 50 kiloelectron volts (keV) on a vector-scan JEOL JBX-5DII machine. Nominal resist sensitivity was 10 uC/cm$^2$. The beam current was 100 picoamps (pA) and the spot diameter was 50 nanometers (nm). Probe current was optimized for best resolution in each exposed sample. Exposure doses ranged from 6 to 15 uC/cm$^2$.

Figure 5A:
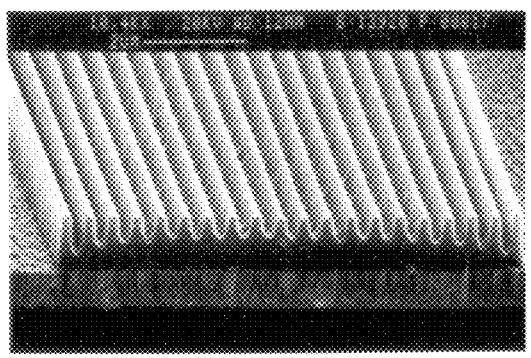
FIG. 5 represent scanning electron micrographs of resolution structures consisting of 0.25 microns equal lines and spaces written in a negative-tone chemically amplified resist with sensitivity of 10 uC/cm$^2$ (a) without SiO$_2$ and (b) with 200 nm SiO$_2$ layer interposed between the resist and tungsten on silicon support, with electron beam exposure at 50 keV.
Figure 5B:
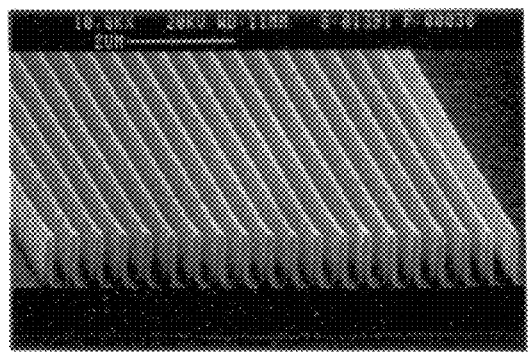

Results of the experiment are shown in FIG. 5 where on the left, is seen exposed and developed pattern without the silicon dioxide layer. Since this resist was negative, the highest level of the resist represent the primary beam exposure. Regions between the primary exposure sites contain resist due to crosslinking caused by scattered electrons. On the right of FIG. 5 there is the same system exposed in the same way as the left side of FIG. 5, but with the silicon dioxide layer present. On the right side, clean, proximity-free patterns are derived.

Figure 6:
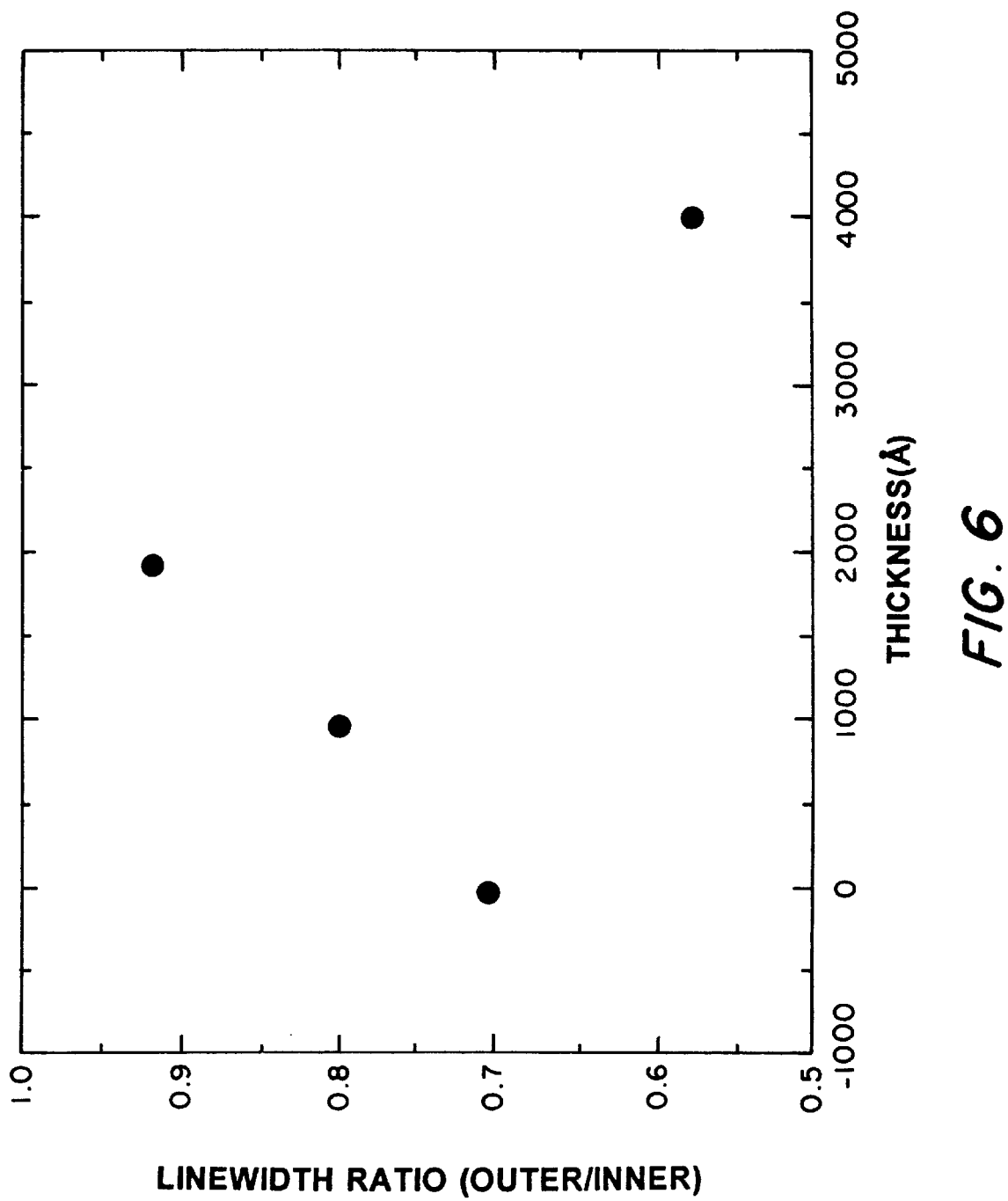
FIG. 6 is a graph of the ratio of the outer-most proximity exposure linewidth to the central linewidth as a function of the intermediary layer thickness for the gratings of 0.25 $\mu$m lines and spaces. Interposition of a dielectric layer between a resist and an absorber disposed on a transparent support.

The influence of the thickness of the dielectric intermediary layer is seen in FIG. 6. It should be noted that the distribution of energy deposited in the resist is not uniform but is a function of lateral displacement along the surface of the resist in a direction perpendicular to the direction of the lines. Consequently, the linewidths are a function of the lateral displacement: they are greatest in the central lines of the grating, since the proximity effect is highest here, while the outer-most lines are least subjected to this effect. In FIG. 6, the ratio of the outer-most proximity exposure linewidths to the central linewidths is plotted as a function of intermediary layer thickness. When the ratio is near unity, the effect is small and uniform through the grating. When the ratio is zero, there is a strong effect, varying inhomogeneously through the grating. As can be seen from FIG. 6, as the thickness is increased to 2000 angstroms, proximity effect is alleviated and nearly eliminated. Increasing the thickness beyond 2000 angstroms, degrades the image, probably due to insulator charging. It appears that if the proximity effects were due to full energy of 50 keV electrons, the thin silica or silicon dioxide layer would present a small barrier to proximity scattering. Also, if high energy backscattered charges were responsible, the full thickness of the resist layer between exposure sites would be exposed. But the proximity exposure is most likely not due to these high energy electrons.

Inspection of FIG. 6 indicates that the maximum thickness of resist exposed between the primary exposure sites at the center of the pattern is about 2000 angstroms. As a rule of thumb, the range of electrons in resist is about 100 nm per keV. It could thus be estimated that the energy of the exposing electrons is about 2 keV. It is also interesting to note that the thickness of the proximity-exposed resist is about the same as the optimal insulator thickness cited above.

These electrons probably come from all backscattered electrons, including fast secondary and secondary electrons, created by interaction of the primary beam with the substrate. The silica or silicon dioxide insulator layer is of a low atomic weight, absorbs little energy from the primary beam and is a poor source of low-energy backscattered electrons. High energy backscattering electrons are diffuse, interact weakly with the resist, and are not the primary source of proximity exposure. In addition, the silica or silicon dioxide layer will charge during exposure. This charge can serve to repel low energy electrons from the support. If the charged insulator thickness is small, all the image of the charge will occur in the underlying tungsten absorber. As such, it will not deflect the incident beam.

What is claimed is:

1. In a method for making an electronic mask using a high voltage electron beam, which mask comprises a support medium, an absorber layer disposed above said support medium, and a resist layer disposed above said absorber layer, the improvement comprising the step of providing a dielectric layer between said absorber layer and said resist layer, said dielectric layer having the function of preventing at least some electrons from reentering said resist layer.

2. Method of claim 1 including the step of directing high voltage electrons from an electron beam operating at 1 to 500 kiloelectron volts at said resist layer.

3. Method of claim 2 wherein the electron beam operates at about 10 to 100 kiloelectron volts, the dielectric layer is about 1 to about 1000 nm thick and said support is selected from thin and thick supports, said thin supports are about 0.01 to about 10 um thick and are selected from silicon carbide, silicon nitride, boron nitride, diamond, carbon, and silicon, and said thick supports are about 1 to about 1500 um thick and are selected from glasses and quartz.

4. Method of claim 3 wherein said absorber is selected from chromium, ferric oxide, tungsten, and gold and thickness thereof is about 30 to 1000 nm.

5. Method of claim 4 wherein said dielectric layer is about 10 to 400 nm thick and is selected from the group consisting of silicon nitrides and wherein said resist layer is selected from the group consisting of negative resists which is about 10 to 1000 nm thick.

6. In a method for making an electronic mask using an electron beam rated at about 10 to 100 kiloelectron volts, said mask comprising a support transparent to x-rays selected from silicon carbide, silicon nitride, biron nitride, diamond, silicon, and carbon; an absorber layer disposed on said support selected from tungsten and gold; and a negative resist disposed on said absorber layer selected from chemically amplified novolac resists; the improvement in the method for making said mask comprising the steps of providing a dielectric layer between said absorber layer and said resist layer about 1 to about 1000 nm thick, said dielectric layer having the function of reducing proximity effects in the pattern written with said electron beam on said resist.

7. Method of claim 6 wherein said support is about 0.01 to about 10 $\mu$m thick; said absorber layer is about 1 to about 1500 nm thick; said dielectric layer is selected from the group consisting of silicon nitrides and is about 1 to about 500 nm thick; and said resist layer is about 10 to 1000 nm thick.

8. Method of claim 6 wherein said support is about 0.1 to 5 um thick; said absorber layer is about 30 to 1000 nm thick, said dielectric layer is about 10 to 400 nm thick, and said resist layer is a negative resist of about 10 to 1000 nm thick; said method also including the step of depositing up to two stop etch layers.

* * * * *